(12) United States Patent
Sakurai et al.

(10) Patent No.: US 9,142,868 B2
(45) Date of Patent: Sep. 22, 2015

(54) CHARGE/DISCHARGE CONTROL CIRCUIT AND BATTERY DEVICE

(75) Inventors: Atsushi Sakurai, Chiba (JP); Kazuaki Sano, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 572 days.

(21) Appl. No.: 13/533,321

(22) Filed: Jun. 26, 2012

(65) Prior Publication Data

US 2013/0134942 A1    May 30, 2013

Related U.S. Application Data

(60) Provisional application No. 61/564,485, filed on Nov. 29, 2011.

(51) Int. Cl.
| | |
|---|---|
| *H02J 7/00* | (2006.01) |
| *H01M 10/46* | (2006.01) |
| *H01M 10/48* | (2006.01) |
| H01M 10/42 | (2006.01) |
| G01R 31/36 | (2006.01) |

(52) U.S. Cl.
CPC ............ *H01M 10/46* (2013.01); *H01M 10/486* (2013.01); *H02J 7/0021* (2013.01); *G01R 31/362* (2013.01); *H01M 2010/4271* (2013.01); *Y02T 10/7055* (2013.01)

(58) Field of Classification Search
CPC .. H02J 7/0016; H02J 7/0018; Y02T 10/7055; Y02E 60/12; H01M 10/441

USPC ........................................................ 320/118
See application file for complete search history.

(56) References Cited

U.S. PATENT DOCUMENTS

| | | | |
|---|---|---|---|
| 2002/0027448 A1* | 3/2002 | Bacigalupo ..................... 326/83 |
| 2005/0242775 A1* | 11/2005 | Miyazaki et al. .............. 320/116 |
| 2006/0028179 A1* | 2/2006 | Yudahira et al. .............. 320/133 |
| 2010/0060084 A1 | 3/2010 | Tange et al. |

FOREIGN PATENT DOCUMENTS

JP    2004-282798 A    10/2004

* cited by examiner

*Primary Examiner* — Arun Williams
(74) *Attorney, Agent, or Firm* — Brinks Gilson & Lione

(57) ABSTRACT

Provided are a charge/discharge control circuit having a self-test function, which can dispense with a complicated test device, and a battery device. The battery device includes the charge/discharge control circuits each including a pull-up/pull-down circuit provided at a terminal to which a secondary battery is to be connected. When a self-test start signal is input so as to enter a self-test state, a self-test control circuit controls the pull-up/pull-down circuit, to thereby perform a test on a voltage detection circuit provided at the terminal to which the secondary battery is to be connected. When the self-test is finished, a self-test start signal is output to a next-stage charge/discharge control circuit, to thereby perform a test sequentially on the voltage detection circuits of the cascade-connected charge/discharge control circuits.

8 Claims, 4 Drawing Sheets

US 9,142,868 B2

CHARGE/DISCHARGE CONTROL CIRCUIT AND BATTERY DEVICE

RELATED APPLICATIONS

Pursuant to 35 U.S.C. §119(e), this application claims the benefit of the filing date of Provisional U.S. Patent Application Ser. No. 61/564,485 filed on Nov. 29, 2011. The entire content of this application is hereby incorporated by reference.

BACKGROUND OF THE INVENTION

1. Field of the Invention

The present invention relates to a charge/discharge control circuit for controlling charge/discharge of a secondary battery, and a battery device, and more specifically, to a charge/discharge control circuit having a self-test function for a voltage detection circuit for detecting a voltage of a secondary battery, and a battery device.

2. Description of the Related Art

A battery device is used as a voltage supply source for circuits of various electronic devices. In recent years, the battery device has been required to output a high voltage as a power supply for automobiles and electric tools. Therefore, there is needed a battery device in which a plurality of secondary batteries are connected in series and which includes a plurality of cascade-connected charge/discharge control circuits for controlling charge/discharge of the secondary batteries (see, for example, Japanese Patent Application Laid-open No. 2009-17732).

FIG. 4 illustrates a block diagram of a conventional battery device including series-connected secondary batteries and cascade-connected charge/discharge control circuits for controlling the secondary batteries.

The conventional battery device includes a plurality of cascade-connected charge/discharge control circuits 401a to 401n, a plurality of series-connected secondary batteries 402a to 402n, a charge control FET 403, a discharge control FET 404, resistors 405a to 405n each connecting a charge control terminal CO and a charge control signal input terminal CTLC, and resistors 406a to 406n each connecting a discharge control terminal DO and a discharge control signal input terminal CTLD.

In the conventional battery device, the charge/discharge control circuits 401a to 401n are connected to each other via the charge control terminal CO and the charge control signal input terminal CTLC and via the discharge control terminal DO and the discharge control signal input terminal CTLD, thus enabling reciprocal communication. In this manner, the plurality of charge/discharge control circuits can be connected in series, and hence a necessary number of series-connected secondary batteries for outputting a high voltage can be controlled.

In the above-mentioned battery device, however, the number of voltage detection circuits increases as the number of secondary batteries increases. Therefore, there has been a drawback that a device for testing each voltage detection circuit becomes complicated in the state of being assembled as a battery device.

SUMMARY OF THE INVENTION

The present invention has been made in order to solve the problem described above, and provides a charge/discharge control circuit having a self-test function, which can dispense with a complicated test device, and also provides a battery device.

In order to solve the conventional problem, a charge/discharge control circuit and a battery device according to the present invention have the following configurations.

A charge/discharge control circuit includes a self-test circuit for testing a function of detection circuits for detecting voltages of a plurality of secondary batteries connected in series. The self-test circuit includes: a pull-up/pull-down circuit, which is provided at each of terminals to which the secondary batteries are to be connected; and a self-test control circuit for controlling the pull-up/pull-down circuit. When a test is finished, a self-test start signal is output to a next-stage charge/discharge control circuit.

Further, a battery device includes a plurality of the charge/discharge control circuits which are cascade-connected, and a plurality of secondary batteries connected to the plurality of the charge/discharge control circuits.

According to the present invention, it is possible to provide the charge/discharge control circuit and the battery device, which can dispense with a complicated test device.

DETAILED DESCRIPTION OF THE PREFERRED EMBODIMENTS

Hereinafter, an embodiment of the present invention is described with reference to the drawings.

Figure 1:
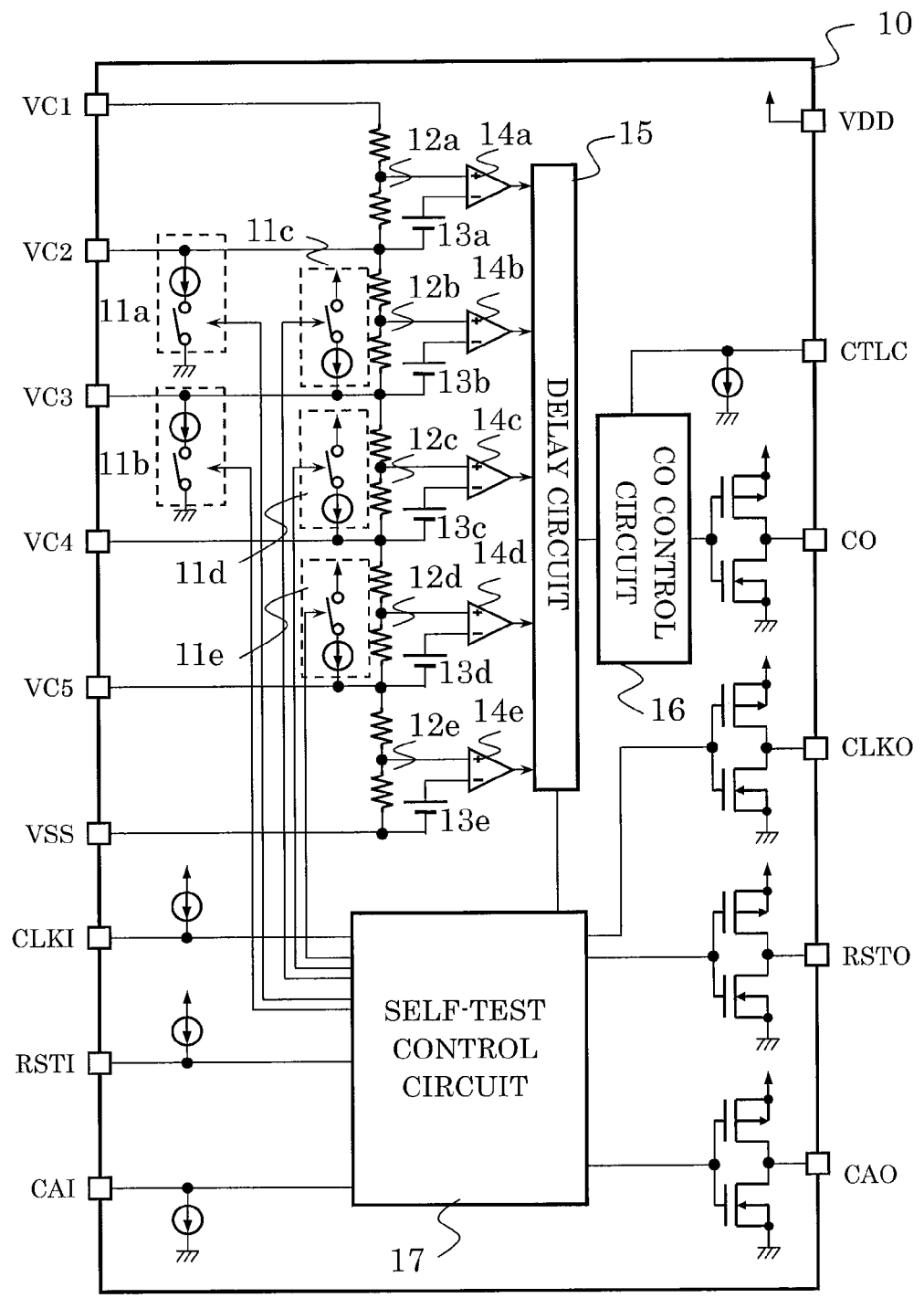
FIG. 1 is a circuit diagram of a charge/discharge control circuit according to an embodiment of the present invention.

FIG. 1 is a circuit diagram of a charge/discharge control circuit according to the embodiment of the present invention.

A charge/discharge control circuit 10 according to the embodiment of the present invention includes pull-up/pull-down circuits 11a to 11e, each of which includes a current source and a switch circuit, voltage dividing circuits 12a to 12e, reference voltage circuits 13a to 13e, comparator circuits 14a to 14e, a delay circuit 15, a CO control circuit 16, and a self-test control circuit 17. The charge/discharge control circuit 10 further includes a power supply terminal VDD, terminals VC1 to VC5 and VSS to which secondary batteries are to be connected, a clock signal input terminal CLKI, a clock signal output terminal CLKO, a charge control signal output terminal CO, a charge control signal input terminal CTLC, a reset signal input terminal RSTI, a reset signal output terminal RSTO, a self-test state signal input terminal CAI, and a self-test state signal output terminal CAO. In addition, the charge/discharge control circuit 10 further includes an overcharge detection circuit (not shown) and the like.

The terminals VC1 to VC5 and VSS are connected to the voltage dividing circuits 12a to 12e and the reference voltage circuits 13a to 13e. The comparator circuits 14a to 14e respectively compare divided voltages output from the voltage dividing circuits 12a to 12e with reference voltages output from the reference voltage circuits 13a to 13e. The delay circuit 15 delays output signals of the comparator circuits 14a to 14e by a predetermined time period, and outputs a signal to the CO control circuit 16. The CO control circuit 16 receives, as an input, a next-stage charge control signal, which is input to the charge control signal input terminal CTLC. The CO control circuit 16 outputs the received signal to the charge control signal output terminal CO together with the output signal of the delay circuit 15. In other words, the CO control circuit 16 functions as a self-test result communication circuit.

The self-test control circuit 17 receives, as inputs, a clock signal input to the clock signal input terminal CLKI and a reset signal input to the reset signal input terminal RSTI, to thereby start a self-test. The self-test control circuit 17 controls the pull-up/pull-down circuits 11a to 11e to execute the self-test. Further, the self-test control circuit 17 receives a next-stage self-test state signal from the self-test state signal input terminal CAI as an input, and outputs a self-test state signal to the self-test state signal output terminal CAO, a reset signal to the reset signal output terminal RSTO, and a clock signal to the clock signal output terminal CLKO, to thereby control the self-test. In addition, when the self-test is started, the self-test control circuit 17 outputs a signal to the delay circuit 15, to thereby shorten a delay time period of the delay circuit 15.

Figure 2:
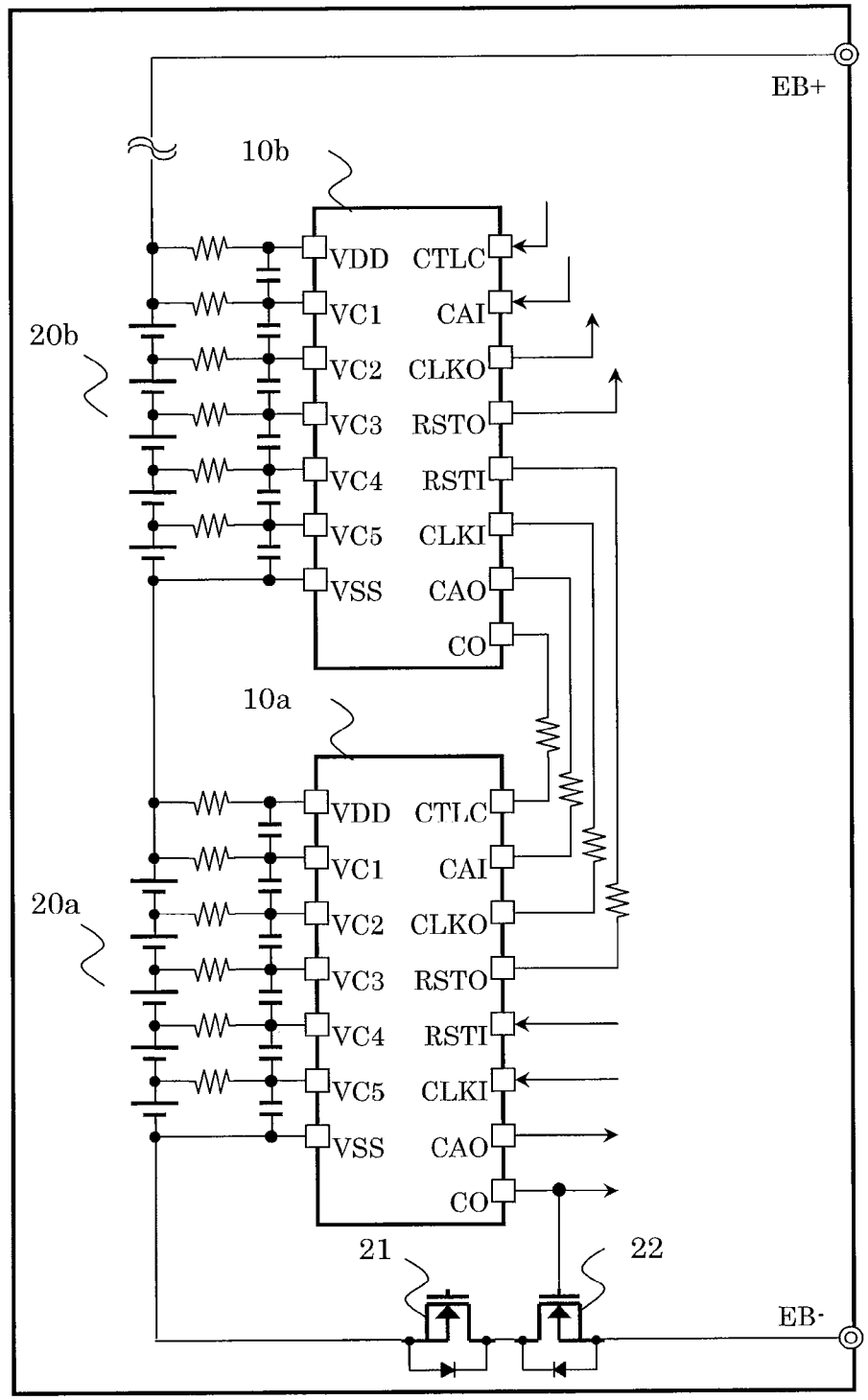
FIG. 2 is a block diagram of a battery device according to the embodiment of the present invention.

FIG. 2 is a block diagram of a battery device according to the embodiment of the present invention. The battery device according to the embodiment of the present invention includes charge/discharge control circuits 10a, 10b ( ... 10n) illustrated in FIG. 1, series-connected secondary batteries 20a, 20b ( ... 20n), a discharge control FET 21, a charge control FET 22, and external terminals EB+ and EB−.

The secondary batteries 20a and 20b are respectively connected to the terminals VDD, VC1 to VC5, and VSS of the charge/discharge control circuits 10a and 10b via resistors. The charge control signal input terminal CTLC is connected to a charge control signal output terminal CO of a next-stage charge/discharge control circuit 10x. The self-test state signal input terminal CAI is connected to a self-test state signal output terminal CAO of the next-stage charge/discharge control circuit 10x. The clock signal output terminal CLKO is connected to a clock signal input terminal CLKI of the next-stage charge/discharge control circuit 10x. The reset signal output terminal RSTO is connected to a reset signal input terminal RSTI of the next-stage charge/discharge control circuit 10x. To the reset signal input terminal RSTI and the clock signal input terminal CLKI of the first-stage charge/discharge control circuit 10a, a reset signal for starting a self-test and a clock signal are input, respectively. Further, the self-test state signal output terminal CAO of the first-stage charge/discharge control circuit 10a outputs a self-test state signal, and the charge control signal output terminal CO thereof outputs a signal for controlling the charge control FET 22 and a signal indicating the result of the self-test. In other words, the charge control signal output terminal CO functions as a communication terminal for an overcharge detection signal and a communication terminal for a self-test result signal.

In this case, the reset signal and the clock signal may be produced inside the battery device by an external signal, or may be supplied from an external device connected to the battery device. Further, the self-test state signal and the self-test result signal to be output may be detected by a circuit provided inside the battery device, or may be output directly to an external device connected to the battery device.

A battery device including a plurality of the above-mentioned charge/discharge control circuits 10 has a function of performing a self-test through the following operation.

Figure 3:
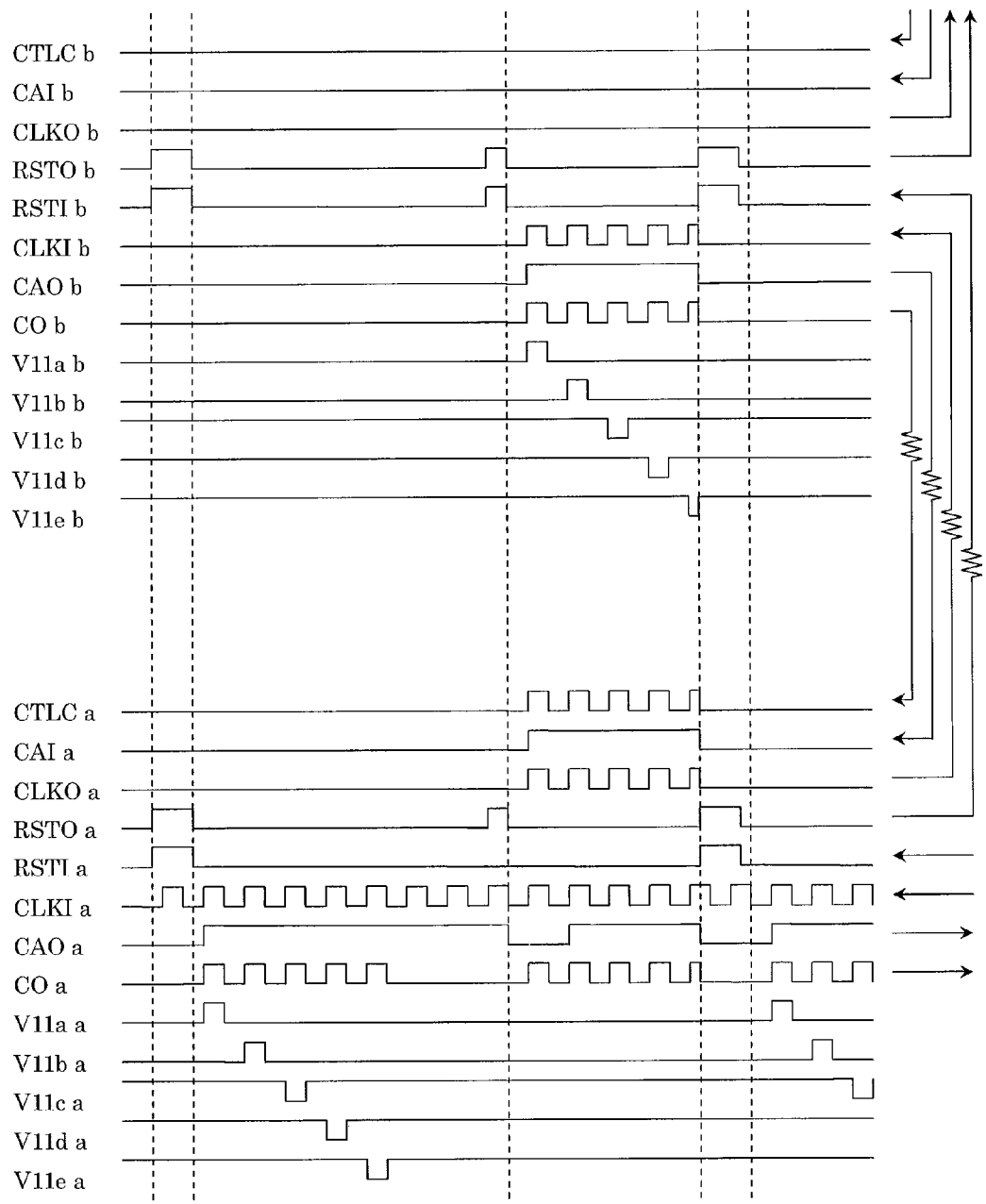
FIG. 3 is a timing chart of the charge/discharge control circuit and the battery device according to the embodiment of the present invention.
Figure 4:
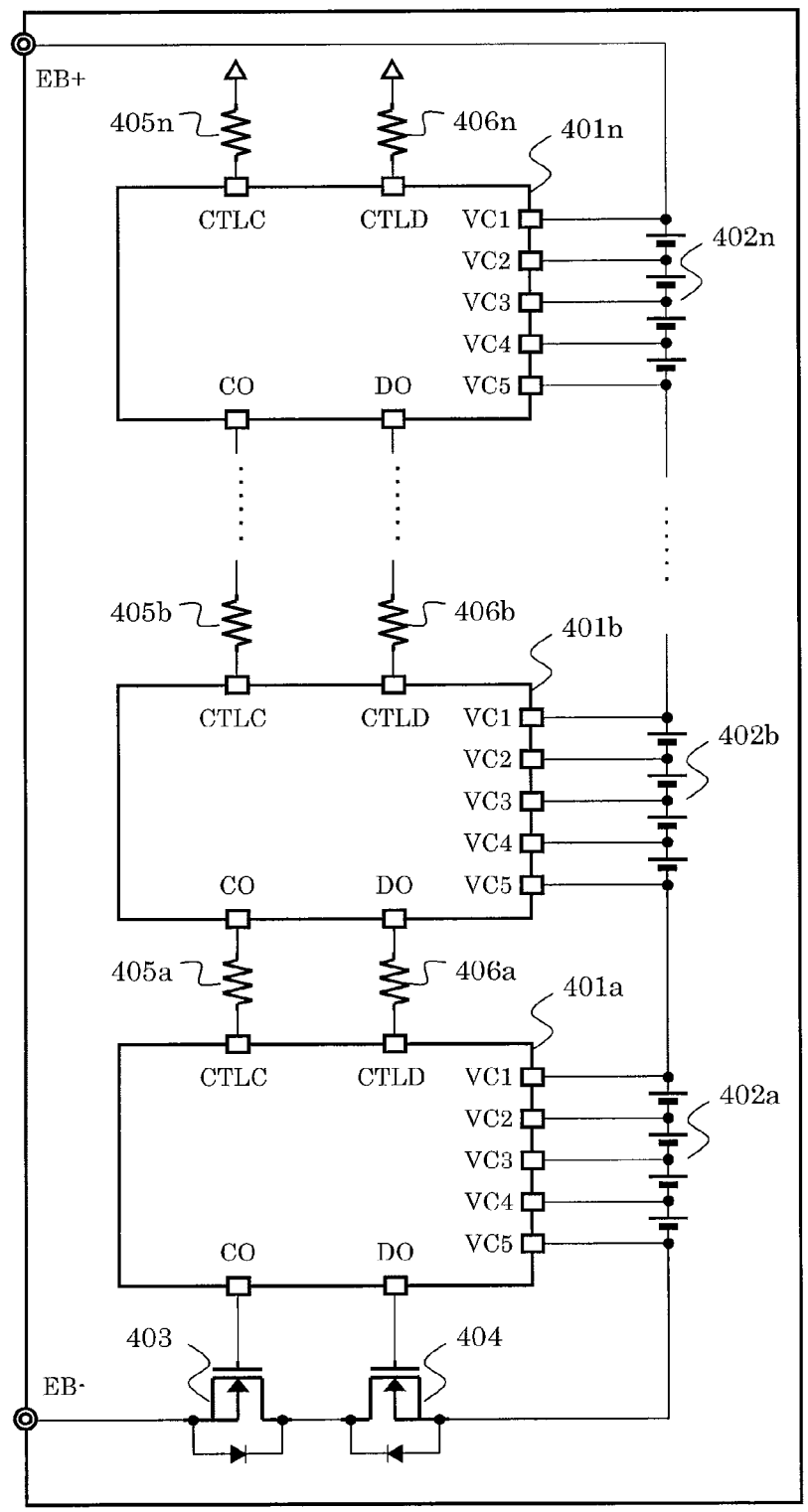
FIG. 4 is a block diagram of a conventional battery device.

FIG. 3 is a timing chart of the charge/discharge control circuit and the battery device according to the embodiment of the present invention.

First, a reset signal and a clock signal are input to a reset input terminal RSTI and a clock signal input terminal CLKI of a charge/discharge control circuit 10a, respectively.

When the reset signal is input to the reset input terminal RSTI, the charge/discharge control circuit 10 performs a self-test in synchronization with the clock signal after the reset is released. In other words, the clock signal functions as a self-test start signal. The reset signal input to the reset input terminal RSTI is output from the reset output terminal RSTO and is input to a reset input terminal RSTI of a next-stage charge/discharge control circuit 10. The clock signal input to the clock signal input terminal CLKI is not output from the clock signal output terminal CLKO unless the self-test is finished. Therefore, the next-stage charge/discharge control circuit 10 does not perform a self-test even when a reset signal is input thereto. In this manner, the charge/discharge control circuit 10 sequentially performs a self-test.

When the reset signal is released, the charge/discharge control circuit 10a outputs a self-test state signal from the self-test state signal output terminal CAO in synchronization with the clock signal.

The self-test state signal is controlled by the self-test control circuit 17 so that the waveform thereof indicates which of the charge/discharge control circuits 10 is in the self-test state. When the next-stage charge/discharge control circuit 10 enters the self-test state, the self-test state signal input to the self-test state signal input terminal CAI is output from the self-test state signal output terminal CAO similarly in synchronization with the clock signal. In other words, based on the delay of the waveform change by one clock signal, which stage of the charge/discharge control circuits 10 is performing a self-test can be detected by the self-test state signal output from the first-stage charge/discharge control circuit 10a.

In the charge/discharge control circuit 10a in the self-test state, the pull-up/pull-down circuits 11a to 11e are sequentially controlled by the self-test control circuit 17.

According to the charge/discharge control circuit 10 of the embodiment of the present invention, for example, the pull-up/pull-down circuit 11a is connected to the terminal VC2, the pull-up/pull-down circuits 11b and 11c are connected to the terminal VC3, the pull-up/pull-down circuit 11d is connected to the terminal VC4, and the pull-up/pull-down circuit 11e is connected to the terminal VC5. How to form and arrange the pull-up/pull-down circuits is not limited to the embodiment of the present invention as long as all the comparator circuits 14a to 14e can be tested.

Upon the start of a self-test, a voltage V11a is output from the self-test control circuit 17 in synchronization with the first clock signal, and the pull-up/pull-down circuit 11a pulls down a voltage of the terminal VC2. The current source is designed to have such a current value that a voltage between the terminal VC1 and the terminal VC2 may be higher than a detection voltage of the comparator circuit 14a. Therefore, the comparator circuit 14a outputs a detection voltage H in a normal case and does not output the detection voltage H in an abnormal case. In synchronization with the next clock signal, a voltage V11b is output from the self-test control circuit 17, and the pull-up/pull-down circuit 11b pulls down a voltage of the terminal VC3.

In this manner, in synchronization with the clock signal, all the comparator circuits 14a to 14e are tested, and the results of the tests are output from the charge control signal output terminal CO.

When the self-test is finished, in synchronization with the final clock signal, a reset signal is output from the reset output terminal RSTO and is input to a reset input terminal RSTI of the charge/discharge control circuit 10b. Then, the next clock signal is input to a clock signal input terminal CLKI of the charge/discharge control circuit 10b via the clock signal output terminal CLKO. The charge/discharge control circuit 10b, to which the reset signal and the clock signal have been input, starts a self-test in synchronization with the clock signal. Although the reset signal is input to the charge/discharge control circuit 10b again in this embodiment, this function may be eliminated unless otherwise necessary because the charge/discharge control circuit 10b has become the self-test state in response to the first reset signal.

The charge/discharge control circuit 10b outputs a self-test state signal from the self-test state signal output terminal CAO to the self-test state signal input terminal CAI of the charge/discharge control circuit 10a in synchronization with the first clock signal. In response to the next clock signal, the charge/discharge control circuit 10a changes the self-test state signal input from the charge/discharge control circuit 10b, and outputs a self-test state signal whose waveform change is delayed by one clock signal, from the self-test state signal output terminal CAO.

As described above, the charge/discharge control circuits 10a to 10n sequentially perform a self-test and output a self-test state signal and a detection result. Therefore, by detecting those signals inside the battery device or by an externally-connected electronic device, all the voltage detection circuits of all the charge/discharge control circuits 10a to 10n can be tested.

As described as the charge/discharge control circuits 10a to 10n, the number of the charge/discharge control circuits provided in the battery device according to the embodiment of the present invention is not limited, and can be set in accordance with an appropriate setting of bits of the self-test state signal shown in the timing chart of FIG. 3.

As described above, with the use of the charge/discharge control circuit according to the embodiment of the present invention, it is possible to provide a battery device having a self-test function, which can dispense with a complicated test device.

Note that, although not shown, when a self-test is not performed, it is possible to power down circuits relating to communication of a self-test, such as the pull-up/pull-down circuits 11a to 11e and the self-test control circuit 17, to thereby prevent an increase in power consumption during the normal operation.

What is claimed is:

1. A charge/discharge control circuit for controlling charge/discharge of a plurality of secondary batteries connected in series, the charge/discharge control circuit comprising:
   a voltage detection circuit, which is provided at each of terminals to which the plurality of secondary batteries are to be connected;
   a detection signal output terminal for outputting a detection signal of the voltage detection circuit;
   a self-test circuit for self-testing a function of the voltage detection circuit after receiving a self-test start signal; and
   a self-test start signal input terminal configured to receive a signal to cause the self-test circuit to begin self-testing operations and a self-test start signal output terminal configured to output a signal to indicate that self-testing is finished, wherein the self-test start signal input and output terminals facilitate triggering, by a first charge/discharge control circuit, a second charge/discharge control circuit to start self-testing when the first charge/discharge control circuit has finished self-testing.

2. A charge/discharge control circuit according to claim 1, wherein the self-test circuit comprises:
   a pull-up/pull-down circuit, which is provided at the each of the terminals to which the plurality of secondary batteries are to be connected; and
   a self-test control circuit for controlling the pull-up/pull-down circuit, to thereby test the voltage detection circuit.

3. A charge/discharge control circuit according to claim 2, further comprising a self-test state signal input terminal and a self-test state signal output terminal,
   wherein the self-test control circuit outputs, to the self-test state signal output terminal, a self-test state signal indicating a state of the self-test and a self-test state signal which has been input to the self-test state signal input terminal.

4. A charge/discharge control circuit according to claim 3, wherein the self-test control circuit outputs the self-test state signal, which is received at the self-test state signal input terminal, to the self-test state signal output terminal after delaying the self-test state signal by a predetermined time period.

5. A charge/discharge control circuit according to claim 2, wherein the charge/discharge control circuit suspends its operation so that at least the pull-up/pull-down circuit consumes no current during a normal operation in which the self-test is not performed.

6. A charge/discharge control circuit according to claim 1, further comprising a self-test result signal input terminal, a self-test result signal output terminal, and a self-test result communication circuit,
   wherein the self-test result communication circuit outputs, from the self-test result signal output terminal, a self-test result signal indicating a result of the self-test, which has been output from the voltage detection circuit, and a self-test result signal received at the self-test result signal input terminal.

7. A charge/discharge control circuit according to claim 6, wherein:
   the self-test result signal output terminal serves also as the detection signal output terminal;
   the charge/discharge control circuit further comprises a delay circuit
   between the voltage detection circuit and the detection signal output terminal;
   and the self-test control circuit shortens a delay time period of the delay circuit during the self-test.

8. A battery device, comprising:
   a plurality of the charge/discharge control circuits according to claim 1 which are cascade-connected; and
   a plurality of secondary batteries connected to the plurality of the charge/discharge control circuits.

* * * * *